United States Patent
Hunsperger

[11] 3,952,265
[45] Apr. 20, 1976

[54] MONOLITHIC DUAL MODE EMITTER-DETECTOR TERMINAL FOR OPTICAL WAVEGUIDE TRANSMISSION LINES

[75] Inventor: Robert G. Hunsperger, Malibu, Calif.

[73] Assignee: Hughes Aircraft Company, Culver City, Calif.

[22] Filed: Oct. 29, 1974

[21] Appl. No.: 518,322

[52] U.S. Cl. .......... 331/94.5 H; 350/96 C; 350/96 WG; 350/160 R; 357/19
[51] Int. Cl.² .......... H01S 3/18; H01L 31/12
[58] Field of Search .......... 331/94.5 H; 350/96 C, 350/96 WG, 160 R; 357/17–19

[56] References Cited
UNITED STATES PATENTS

| | | | |
|---|---|---|---|
| 3,431,512 | 3/1969 | Redfield | 350/160 R |
| 3,501,679 | 3/1970 | Yonezu et al. | 331/94.5 H |
| 3,518,574 | 6/1970 | Rutz | 331/94.5 H |
| 3,763,407 | 10/1973 | Yazawa | 331/94.5 H |
| 3,768,037 | 10/1973 | Migitaka et al. | 331/94.5 H |

*Primary Examiner*—John K. Corbin
*Assistant Examiner*—Wm. H. Punter
*Attorney, Agent, or Firm*—W. H. MacAllister; D. C. Keaveney

[57] ABSTRACT

There is disclosed a monolithic dual mode emitter-detector terminal for optical waveguide transmission lines such as optical data busses or links which terminal serves in one mode to introduce an optical signal onto the line for transmission from one point and in its other mode to read a signal off of the line at the same point. The line includes a plurality of such terminals each of which is a monolithic device having the dual functions or dual modes of sending and receiving. Each terminal comprises a P-N junction diode positioned in optical signal transmissive relationship to the waveguide element. Associated with the diode are switching means to selectively D-C bias the diode in the forward direction for the emitter mode of operation and in the reverse direction for the detector mode of operation. The diode is formed in a direct bandgap semiconductor having overlapping absorption and emission spectra and being doped to produce maximum emission at the shorter wavelengths of the absorption spectrum to increase the efficiency of the diode as an emitter at the expense of its efficiency as a detector which detector efficiency is increased by the Franz-Keldysh effect which shifts the edge of the absorption spectrum to longer wavelengths in the presence of an electric field such as that produced by reverse biasing the diode.

12 Claims, 5 Drawing Figures

MONOLITHIC DUAL MODE EMITTER-DETECTOR TERMINAL FOR OPTICAL WAVEGUIDE TRANSMISSION LINES

BACKGROUND OF THE INVENTION

Emerging fiber optics and integrated optics technologies promise to have a large impact on communications and information processing technologies. Information transfer by means of fiber optics data busses offers many advantages over competing systems. These advantages are realizable since this field has been strongly stimulated by the recent development of glass fiber waveguides having an attenuation of 20 dB/km a few years ago and more recently of glasses which reduced this value to 2.1 dB/km. This has led to an examination of systems using light emitting diodes, multi-mode waveguide bundles, and photodetector components. Systems using optical fiber transmission lines have the advantage of being free from electromagnetic interference and crosstalk; they have greater security since there is no signal leakage; they have no electrical ground or short circuit problems; they have large bandwidth for their size and weight; they have small size, light weight and great flexibility by comparison to copper wire cable harnesses; they have high temperature tolerances and safety in combustible areas; they have high tensile strength and do not require the use of copper which is becoming a strategic material in short supply. When coupled with the use of integrated optics such systems have the advantage of greater switching speed, and a larger number of carrier frequencies for multiplexing resulting from their greater bandwidth.

The waveguide used in such systems may be either an optical fiber waveguide which contains either a step or a graded change in the refractive index such that light propogating within the fiber is guided in the core region, or it may be a channel waveguide formed in a semiconductor chip to provide a similar change in refractive index. One of the problems in such optical waveguide communication or data links is how to introduce an optical signal onto the line at one point and then to read it off the line at some distant point. One way this can be accomplished in the case of a waveguide consisting of optical fiber bundles is to split off a few of the optical fibers at each desired terminal point and connect them to a discrete light emitter or detector. However, if both transmission and reception are required at a given terminal, either two sub-bundles must be split off or a coupling and/or mixing block must somehow be provided to allow light signals to flow in both directions from the terminal.

SUMMARY OF THE INVENTION

In its simplest form the present invention is a specially tailored P-N junction diode inserted in series with an optical waveguide and supplied with appropriate switching means and control bias voltages. For transmission the diode is forward biased and acts as a light emitting diode (LED). For reception the diode is reverse biased and acts as a junction photo-diode or detector. The diode preferably is formed in a direct-band-gap semiconductor such as gallium arsenide (GaAs) in order to have sufficiently high quantum efficiency as an emitter and sufficiently high sensitivity as a detector. The switching means are preferably electronic switching circuits of any type well known in the art.

In the current art, designers have generally avoided using emitter and detector diodes made of the same semiconductor in the same system because this is relatively inefficient. Semiconductor emitters generally emit light of wavelength approximately corresponding to the bandgap energy, while semiconductor detectors generally have a long wavelength cut off edge also at approximately the bandgap energy. Thus the preferred technique is to use a silicon or germanium detector in conjunction with a gallium arsenide emitter so that the emitted light has a wavelength well short of the cut off wavelength of the detector.

The present invention utilizes the fact that at the present state-of-the-art there are many orders of magnitude difference between the power available from LEDS and the minimum power required for detection by a photodetector which leaves room for compromise on both emission and detection efficiency in order to obtain the convenience, simplicity and multi-tap transmit/receive feature of a dual mode device. The present invention also utilizes the fact that this compromise can be weighted by appropriate doping to produce maximum emission at the shorter wavelengths of the absorption spectrum in order to increase the efficiency of the diode as an emitter at the expense of its efficiency as detector and then rely on the fact that the semiconductor exhibits the Franz-Keldysh effect to shift the edge of the absorption spectrum to a longer wavelength in the presence of a reverse biasing electric field to thereby increase the efficiency of diode as a detector at the longer wavelengths when the diode is reverse biased.

Alternatively one can make a two stage diode in which the doping concentration is changed in one-half of the device to make it suitable for use as a detector and the other half is doped so as to make it a better emitter. For transmission the emitter half of the diode is forward biased and the detector half is zero biased, while for reception the detector half of the diode is reverse biased and the emitter half is zero biased. Either type of device can be used as a terminal either by inserting it directly in series in the transmission line or by connecting it to the end of transmission lines which are in turn connected to a mixing device such as a star coupler or other similar devices known in the art.

DESCRIPTION OF THE DRAWINGS

These and other objects and advantages of the invention will be more apparent from the description below taken in connection with the accompanying drawings wherein like referenced characters refer to like parts throughout and in which.

DETAILED DESCRIPTION OF INVENTION

As noted above, one-way point-to-point fiber optic communication links have in the past been constructed using separate light emitting diodes as transmitters and photoconductors (PC) or photodiodes (PD) as receivers. Furthermore, it has been entirely feasible to construct a network in which one transmitter drives a number of separate receivers. Light energy from a transmitter LED can be coupled into a bundle of optical fibers which can be split into sub-bundles and directed to several PD receiver detectors. In twisted copper conductor digital data buss systems, however, it has been common to combine the functions analogous to these by using impedance matching transformer couplers and electronic switches as a transmit/receive terminal. The receiver input impedances can then be high to permit a large number of receivers on the line and the transmitter driver circuits can be electronically switched to present a high impedance to the buss when inactive and a low impedance when transmitting. In this way efficient coupling is obtained from the transmitter to the buss while negligible signal energy is absorbed by the inactive transmitters connected to the buss. In optical waveguide communication links heretofore, however, no practical means for constructing a two-way multi-terminal optical network or buss has been found. The reason is that there have not heretofore been optical devices available which perform functions analgous to the transformer coupler and electronic switch as used in twisted copper wire pair transmission lines. Various schemes have been proposed for constructing a two-way coupler for a fiber optic buss utilizing devices such as prisms, mirrors, glass rod mixer blocks with bundle splitting; but all of these heretofore proposed devices introduce large insertion losses (estimated from 6 to 12 db per coupler) in series along the buss. These losses make it impractical to couple more than a small number (5 to 10) terminals to a buss. The device described herein performs this function while introducing less than three dB insertion loss per terminal even when inserted in series in the line.

Figure 1:
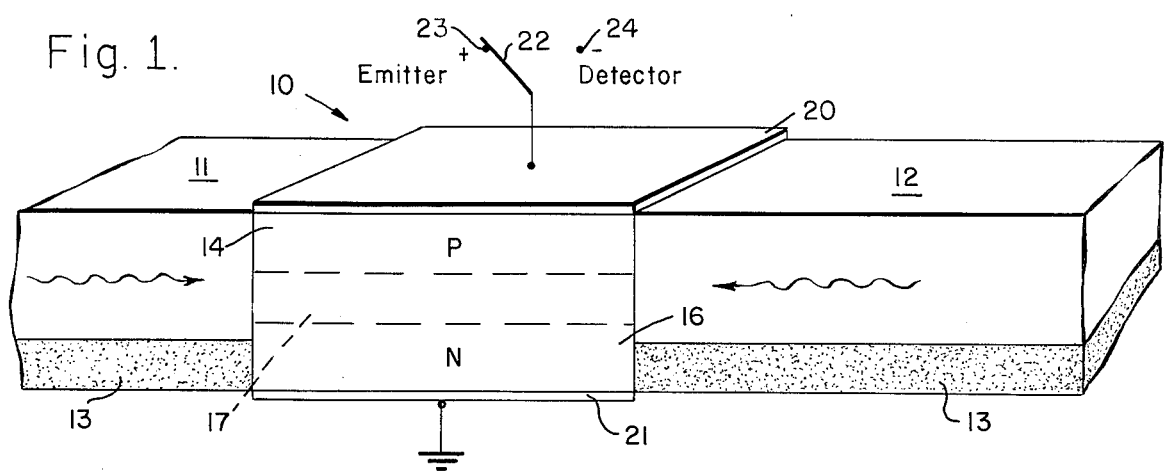
FIG. 1 is a broken away perspective view illustrating an emitter-detector integrally inserted in series in a GaAs waveguide in accordance with the present invention.

A first embodiment of such a device is shown in FIG. 1. A P-N junction diode 10 is shown therein as formed integrally between a first channel waveguide section 11 and a second channel waveguide section 12. These waveguide sections are formed on a substrate 13 in accordance with techniques which are well known in the art. The diode 10 comprises a positively doped (P) region 14, a negatively doped (N) region 16 and a depletion region 17 between the positive and negative regions. The diode is generally rectangular in cross-section and is shown in side view. It is preferably formed from gallium arsenide either by standard diffusion techniques or by ion implantation, including the proton radiation technique disclosed in application Ser. No. 390,836 filed on Aug. 23, 1973 on behalf of Robert G. Hunsperger et al. After the diode has been formed it is provided with top and bottom ohmic contacts 20 and 21 respectively. The bottom contact 21 is connected to ground and the top contact 20 is connected through the equivalent of a single-pole double-throw switch 22 to a source 23 of positive voltage or alternatively to a source 24 of negative voltage. This "switch" would preferably be a high speed electronic circuit. The positive bias voltage is applied by positioning the switch 22 appropriately in order to cause the diode to emit light whereas the negative voltage is applied by the alternate positioning of the switch in order to cause the diode to function as a detector. When the device is acting as an emitter light is emitted in both directions, that is, it is emitted into both waveguide 11 and waveguide 12. When the device 10 is acting as a detector, it detects light received from either waveguide. It will of course be understood that the term light is here being used to include all wavelengths within the infrared, the visible, or the ultra violet regions of the spectrum.

As noted above, it has heretofore been the practice to avoid using emitter and detector diodes made of the same semiconductors in the same system, because it is relatively inefficient. Semiconductor emitters generally emit light of wavelength approximately corresponding to the bandgap energy, while semiconductor detectors generally have a long wavelength cutoff edge also at approximately the bandgap energy. Thus the preferred techniques has been to use a silicon or germanium detector as a separate discrete element in conjunction with a separate gallium arsenide emitter so that the emitted light has a wavelength well short of the cut off wavelength of the detector. However, there are presently many orders of magnitude difference between the power available from LEDS and the minimum power required for detection by a photodiode, leaving much room for compromise on both emission and detection efficiency in order to obtain the convenience, simplicity and multi-tap transmit/receive features of device shown in FIG. 1. In addition the orientation of the light with respect to the junction plane of the diode in this case is such that the light travels parallel to the junction rather than perpendicular to it as in a conventional photodiode detector. This feature allows one to compensate for relatively weak absorption per unit length by making the detector diode longer so that light travels in the active region (i.e. junction depletion region) for a greater length, resulting in increased total absorption. The tradeoff involved in making the diode longer in the direction of light transmission is that detection efficiency is improved at the expense of increased insertion loss in the light signals transmitted through the diode when it is in the standby condition (i.e. neither transmitting or receiving).

Figure 2:
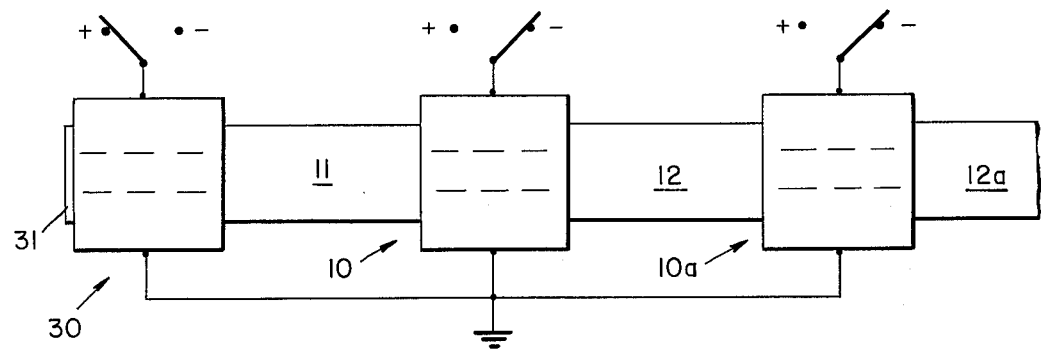
FIG. 2 is a partially schematic sectional view illustrating a waveguide including a plurality of devices of the type shown in FIG. 1 and further including a modified device used to terminate the line.
Figure 3:
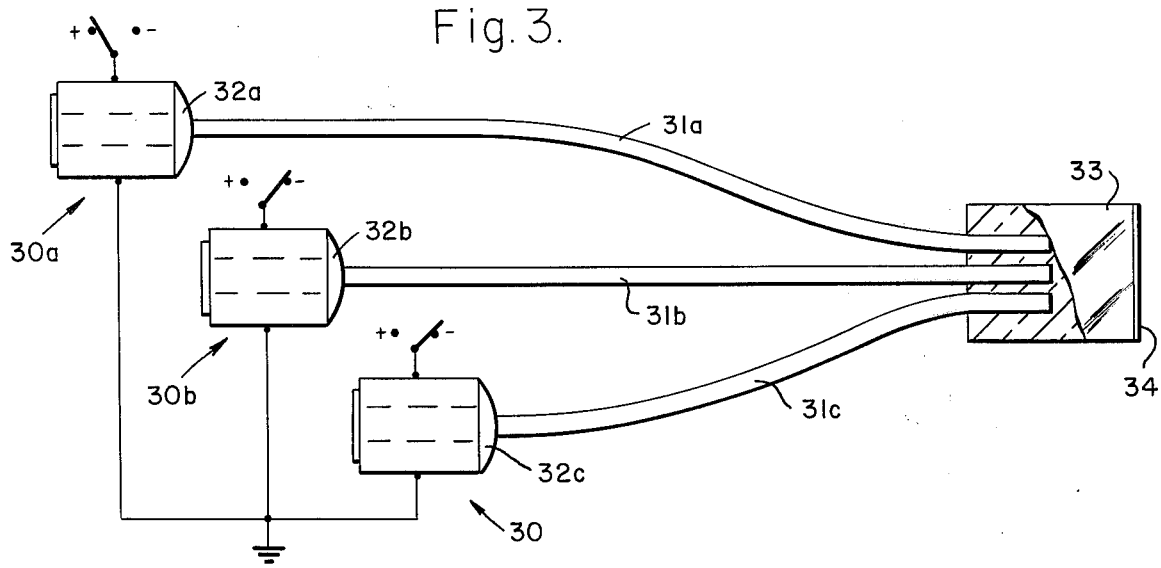
FIG. 3 is a view similar to FIG. 2 but showing an arrangement in which all of the emitter-detector terminals are of the line terminating variety and in which the waveguide lines are connected to each other through a star coupler.

There is a sufficient overlap of the absorption spectrum of gallium arsenide with its emission spectrum to permit the device of FIG. 1 to operate in a system using a plurality of such devices as shown in either FIG. 2 or FIG. 3. The peak emission wavelength of the gallium arsenide light emitting detector as shown in FIG. 1 at room temperature is approximately 9,000 angstrom units and the absorption coefficient of that wavelength is approximately 25 cm$^{-1}$. In the device of FIG. 1 the N region 16 is preferably doped to have an impurity concentration of $1 \times 10^{16}$ cm$^{-3}$ whereas the P region 14 is preferably doped to have an impurity concentration of $2 \times 10^{18}$ cm$^{-3}$.

In operation the Franz-Keldysh effect increases the detection efficiency of the device 10 when the switch 22 is applied to terminal 24 in the following manner.

Figure 1A:
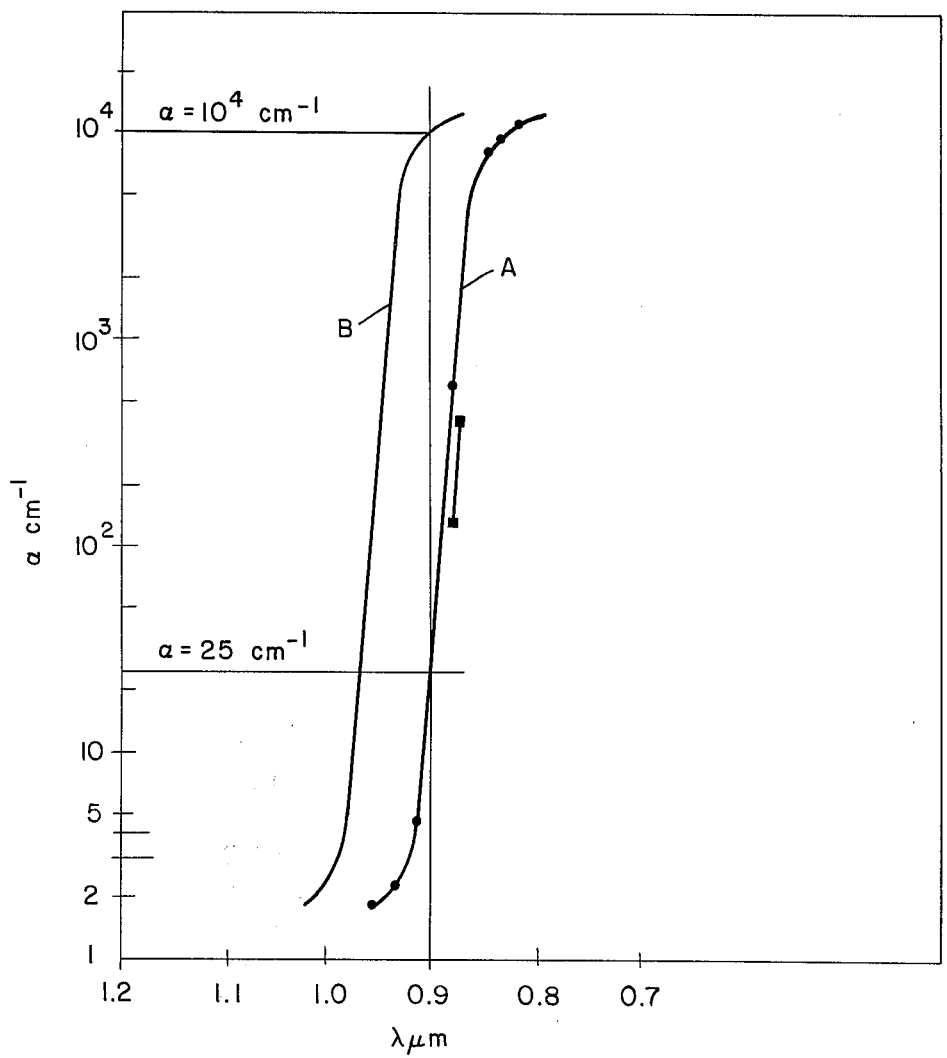
FIG. 1a is a graph showing interband absorption, $\alpha$, as a function of wavelength for GaAs.

A direct bandgap semiconductor such as GaAs has an absorption spectrum like that shown in FIG. 1a which has a very steep "absorption edge" at a wavelength corresponding to roughly the bandgap energy (9000A for GaAs). The semiconductor normally emits light at approximately that same wavelength. Light traveling in the semiconductor is absorbed according to the relation $$\frac{I(x_1)}{I_o} = e^{-\alpha x_1}$$

where $I_o$ is the intensity of the light at some initial point and $I(X_1)$ is the intensity at some point further in the direction of propagation, a distance of $X_1$ from the initial point. Thus the strength of the absorption is strongly related to the exponential "absorption coefficient" ($\alpha$) plotted in FIG. 1a.

In FIG. 1a curve A shows the normal unbiased absorption edge for two samples of N-type GaAs, the points indicated by circles being for GaAs $3 \times 10^{16}/cm^3$ 300° K and the point indicated by squares being for GaAs $5.3 \times 10^{16}/cm^3$ 300° K., both as reported in the literature. Curve B is a calculated GaAs Franz-Keldysh shifted absorption edge for an applied electric field $E = 1.35 \times 10^7$ v/m which corresponds to 50 volts reverse bias on the diode having the disclosed concentration and resulting depletion width of 3.7 microns.

When a semiconductor diode is reverse biased a strong electric field is established across the depletion region of the junction. This electric field causes the absorption edge to shift to longer wavelength as shown in FIG. 1a. This is the well known Franz-Keldysh effect which is described, for example, in "Optical Processes in Semiconductors," by Jacques I. Pankove, (Prentice-Hall), 1971, pg. 29.

The amount of the shift in terms of energy of the photons is given by $$\Delta E = 3/2 \ (m)^{-1/3} \ (qhE)^{2/3}$$

where $m$ is the effective mass of the carriers
$q$ is the electrical charge on the carriers
$h$ is Planck's constant divided by $2\pi$
$E$ is the electric field strength For the case of a GaAs P-N junction with doping as described there is a shift to longer wavelength by 600A for an applied voltage of approximately 50 volts reverse bias. This increases the absorption coefficient to $10^4$ cm$^{-1}$ at the wavelength of 9000A. Since the sensitivity of a photodetector is directly related to the absorption coefficient $\alpha$ this increase in $\alpha$ is accompanied by a corresponding increase in efficiency. Since the absorption coefficient of Si at 9000A is only $5\times 10^2$ cm$^{-1}$ and that of Ge is $6\times 10^3$ cm$^{-1}$, the theoretical calculations indicate that the Franz-Keldysh-shifted GaAs detector will have a higher efficiency than either Si or Ge detectors as are commonly used with GaAs. Improvement in the efficiency of discrete GaAs Schottky barrier detectors per se at a wavelength of 9050A due to the Franz-Keldysh shift has been experimentally demonstrated by Stillman, et al. (G. E. Stillman, C. M. Wolfe, and I. Melngailis, reported in a paper presented at the DoD/Industry-Wide Integrated Optics and Fiber Optics Communications Closed Conference, at Naval Electronics Laboratory Center, San Diego, CA May 15–17, 1974.) Hence, it is now clear that an optimized Franz-Keldysh-shifted GaAs detector will have efficiency at 9000A at least sufficiently high to permit fabrication of the emitter/detector diode of FIG. 1 and practical operation of the series connected system of FIG. 2.

In FIG. 2 a series connected system is shown in which the device 10 of FIG. 1 has connected to its associated waveguide 12, a second device 10a identical with device 10 which includes a waveguide section 12a. The waveguide section 12a is shown broken. Any reasonable number of devices 10 may be thus inserted in series. The waveguide 11 connects to a dual mode end point terminal device 30 which is identical with the device 10 except that only one side of the device is formed integrally with the waveguide 11. An insulating and reflecting surface 31 is applied to the opposite side of the device so that all light generated by the device in its emission mode will be reflected in waveguide 11 whereas all light received by the device in its detector mode will be reflected back into the depletion region of device.

In FIG. 3 a plurality of devices of this type are shown at 30a, 30b and 30c. Each of these devices has an insulating and reflecting surface on one side and a waveguide connected to the other side. In the system of FIG. 3 the waveguides 31a, 31b and 31c respectively are shown as fiber optic bundles rather than channel waveguides. These bundles are cemented to one side of the junction diode as by optical cement, epoxy, or other suitable means indicated generally at 32a, 32b and 32c. The fiber optical bundles each connect into a solid glass member 33 which has a reflecting surface 34 on the side thereof opposite from that into which the optical fibers are inserted. Output from each bundle is thus impinged on the reflecting surface 34 and is reflected back as input to all fibers entering into the mixing block 33. Such an arrangement is conventionally referred to in the art as a "star coupler". The star coupler does not per se form a part of the present invention but only the manner in which the dual mode terminals are used in conjunction with it.

Figure 4:
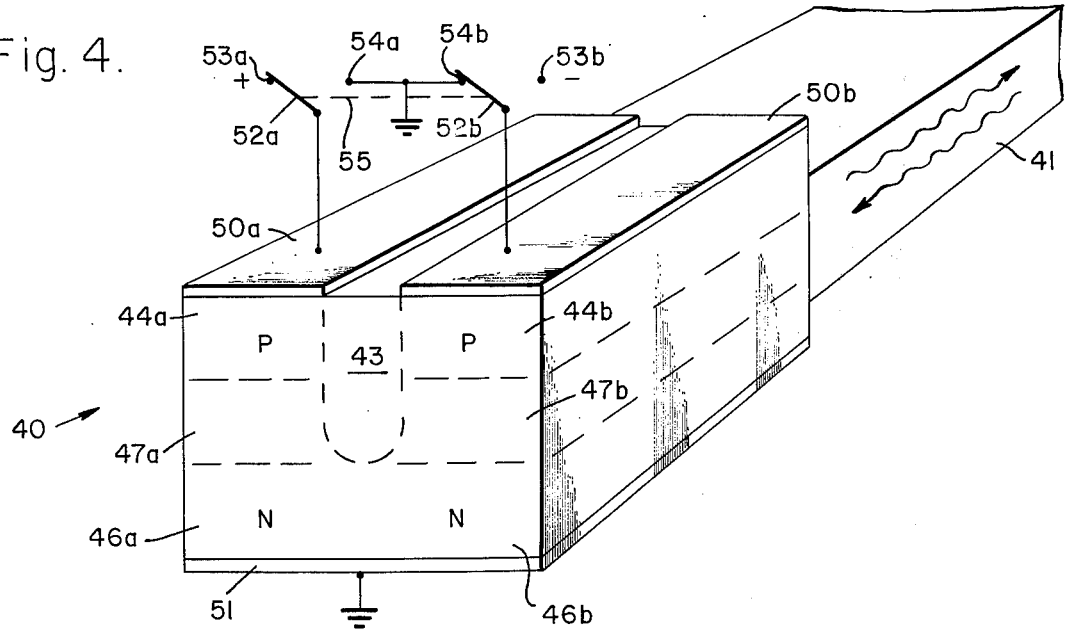
FIG. 4 is a broken away perspective view of an emitter-detector waveguide terminal of the type using two differently doped regions separated by a semi-insulator.

In any and all of the above arrangements it may be desirable to use a two-stage diode of type illustrated in FIG. 4 in place of the single-stage diode illustrated in FIG. 1. The device 40 of FIG. 4 is formed integrally with a waveguide portion 41 which integrally joins the depletion regions of both stages of the device 40. The first stage of the device has a P-type region 44a, an N-type region 46a and a depletion region 47a. The second stage of the device has a P region 44b, an N region 46b, and a depletion region 47b. These two stages are separated by a semi-insulating region 43 which may be produced by proton bombardment.

The bottom surface of the device 40 is provided with an ohmic contact 51 which is preferably connected to ground whereas the top surface of the first stage of the device is provided with an ohmic contact 50a and top surface of the second stage of the device is provide with an ohmic contact 50b. The two contacts 50a and 50b are separated by the semi-insulating region 43. A single-pole double-throw switch 52a or its equivalent is connected to contact 50a and may be connected either to a source 53a of positive voltage to forward bias the device stage for use as an emitter or to a terminal 54a which is preferably grounded so as to apply zero bias to the stage. The second stage of the device is provided with a switch 52b which is connected to contact 50b and which may connect the contact either to a source 53b of negative voltage or to a terminal 54b which is preferably grounded. For transmission the first stage or emitter half of the diode is forward biased and the detector half is zero biased, while for reception the detector half of the diode is reverse biased and the emitter half is zero biased. The switch arm of 52a and 52b are shown in FIG. 4 in the emitter position. The switch arms 52a and 52b are preferably ganged for unitary action by any suitable mechanical coupling means 55 indicated in the drawing by the dashed line 55. This same function may be electrically implemented for higher speed operation for example by a transistor switching circuit.

The device 40 and the waveguide 41 are both preferably formed of gallium arsenide. The N-type regions 46a and 46b may both have an impurity concentration of approximately $10^{18}$ cm$^{-3}$. The P region of the emitter stage 44a is heavily doped for reasons discussed above to permit its more efficient use as an emitter and may, for example, have an impurity concentration in the range of $10^{18}$ cm$^{-3}$ to $10^{19}$ cm$^{-3}$. The P region 44b of the second stage is lightly doped to permit its more efficient use as a detector and may, for example, have a purity concentration of $10^{16}$ cm$^{-3}$. The semi-insulating region 43 may be formed in the intrinsic gallium arsenide by proton bombardment by techniques discussed in the above referenced copending patent application.

While it has been assumed herein that the light emitting function of this terminal will be provided by a non-lasing junction diode which is sufficient in its intensity and efficiency for most systems applications, it will be understood that a junction laser could also be used if required. Such a laser using light feedback indirected by "gratings" formed by channel striations at the contact-semiconductor interfaces is described together with a process of fabrication thereof in U.S. patent application Ser. No. 469,137 filed on May 13, 1974 on behalf of Robert G. Hunsperger et al. and assigned to the Hughes Aircraft Company.

It will further be understood that the device of FIG. 4 may be system connected in the manner illustrated either in FIG. 2 or that illustrated in FIG. 3. Where appropriate the surface of the device opposite the waveguide 41 may be provided with an insulating and reflecting surface such as the reflecting surface 31 shown in device 30 of FIG. 2. Where these reflecting surfaces are used care must be taken to first deposit an insulating layer of a material such as $SiO_2$ so as not to short circuit the junction of the diode. A reflecting material is then applied to this thin insulating layer.

Assuming a reasonable and typical device length of $2\times10^{-2}$ cm and an absorption coefficient $\alpha=25$ cm$^{-1}$ for gallium arsenide, the insertion loss of a device of the type described herein when connected in series in the waveguide is approximately 2dB neglecting reflections at the input and output. These reflections can be minimized by proper index matching at the interfaces. However even in the worst case, assuming a direct GaAs-air interface at each end of the device, reflection losses would be at most 3dB. This magnitude of loss would limit the number of terminals that could be used on one line, but current state-of-the-art LEDS emit optical power as high as 100mW while detectors are capable of sensing microwatt power levels. Thus, a reasonable compromise can be reached for any desired system with a relatively small number of terminals such as is frequently used for intercommunication on an aircraft or other vehicle. For systems requiring a larger number of terminals the LEDS can readily be replaced by lasing junctions in the manner discussed above.

What is claimed is:

1. A monolithic dual mode emitter-detector terminal for optical waveguide transmission lines comprising:
    a. a P-N junction diode;
    b. at least one optical waveguide element positioned in optical signal transmissive relationship with the junction of said diode;
    c. switch means to selectively d-c bias said diode in the forward direction for the emitter mode of operation and in the reverse direction for the detector mode of operation thereof;
    d. said diode being formed in a direct bandgap semiconductor having an absorption spectrum which overlaps its emission spectrum, having a quantum efficiency which is sufficient for said diode to emit light of wavelengths within said emission spectrum when it is forward biased, and having an absorption coefficient which is sufficient for said diode to detect light within said absorption spectrum when it is reverse biased; and
    e. said semiconductor being doped to produce maximum emission at the shorter wavelengths of said emission spectrum to increase the efficiency of the diode as an emitter at the expense of its efficiency as a detector and said semiconductor exhibiting the Franz-Keldysh effect to shift the edge of said absorption spectrum to a longer wavelength in the presence of a reverse biasing electric field to increase the efficiency of the diode as a detector at said longer wavelengths when said diode is reverse biased.

2. A device as in claim 1 wherein said semi-conductor is gallium arsenide.

3. A device as in claim 1 wherein said semi-conductor is gallium arsenide having a peak emission wavelength of approximately 9,000 angstroms and having an absorption coefficient at that wavelength approximately equal to 25 cm$^{-1}$.

4. A device as in claim 1 wherein the width of said junction and the absorption coefficient of said semiconductor are such that said device results in less than 3 dB insertion loss when said device is inserted in series in a waveguide transmission line so that light is transmitted from a first portion of said waveguide through said junction to a second portion of said waveguide.

5. A device as in claim 4 in combination with a first portion of said waveguide positioned in optical signal transmissive relationship with one side of said junction and a second portion of said waveguide positioned in optical signal transmissive relationship with the opposite side of said junction.

6. A device as in claim 1 wherein an optical waveguide element is positioned in optical signal transmissive relationship with only one side of the junction of said diode and an optically reflective surface is positioned in contact with the opposite side of said junction to form a dual mode end point terminal for said transmission line.

7. A device as in claim 1 wherein said P-N junction diode is a single stage diode having one continuous P region of uniform impurity doping extending throughout a first cross section portion of said diode and one continuous N region of uniform impurity doping extending throughout a second cross section portion of said diode, said P region and said N region having a single common interface forming said junction of said diode and giving rise to a depletion layer therein.

8. A device as in claim 1 wherein said P-N junction diode is a two stage monolithic diode, said first and second stages being separated from each other by a semi-insulating region integrally formed in said diode and separating two different junctions formed therein;

each of said stages having a P region and an N region which are contiguous with each other in each respective stage to form a separate junction for that stage;

the P region of said first stage being heavily doped to increase the efficiency of said stage as an emitter;

the P region of said second stage being lightly doped to increase the efficiency of said stage as a detector; and the N regions of said stages having the same doping.

9. A device as in claim 8 wherein said two stage junction diode is formed from gallium arsenide;

wherein said N-type substrate has an impurity doping concentration of approximately $10^{18} cm^{-3}$;

wherein said P region of said heavily doped first stage has an impurity concentration of between $10^{18} cm^{-3}$ and $10^{19} cm^{-3}$; and wherein said lightly doped second stage detector P region has an impurity concentration of approximately $10^{16} cm^{-3}$.

10. A device as in claim 1 wherein said P-N junction diode is provided with power source means for stimulating lasing action.

11. A device as in claim 6 wherein said P-N junction diode is provided with power source means for stimulating lasing action.

12. A device as in claim 8 wherein said first junction stage of said device is provided with power source means for stimulating lasing action.

* * * * *